United States Patent
Gao et al.

(10) Patent No.: US 10,128,409 B2
(45) Date of Patent: Nov. 13, 2018

(54) ALL-INORGANIC PEROVSKITE-BASED FILMS, DEVICES, AND METHODS

(71) Applicant: Florida State University Research Foundation, Inc., Tallahassee, FL (US)

(72) Inventors: Hanwei Gao, Tallahassee, FL (US); Biwu Ma, Tallahassee, FL (US); Yichuan Ling, Tallhassee, FL (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/668,123

(22) Filed: Aug. 3, 2017

(65) Prior Publication Data
US 2018/0040769 A1    Feb. 8, 2018

Related U.S. Application Data

(60) Provisional application No. 62/370,441, filed on Aug. 3, 2016.

(51) Int. Cl.
*H01L 33/26* (2010.01)
*H01L 33/00* (2010.01)

(52) U.S. Cl.
CPC ............ *H01L 33/26* (2013.01); *H01L 33/005* (2013.01)

(58) Field of Classification Search
CPC ............................. H01L 33/26; H01L 33/005
USPC ............................................. 257/103; 438/29
See application file for complete search history.

(56) References Cited

U.S. PATENT DOCUMENTS

| | | | | |
|---|---|---|---|---|
| 2016/0005547 A1* | 1/2016 | Seok | ................... | H01L 51/4226 136/255 |
| 2017/0358745 A1* | 12/2017 | Juang | .................... | C09K 11/06 |
| 2018/0033976 A1* | 2/2018 | Guo | ..................... | H01L 51/0077 |
| 2018/0102494 A1* | 4/2018 | Yu | ....................... | H01L 51/5032 |

OTHER PUBLICATIONS

Natalia Yantara, "Inorganic Halide Perovskites for Efficient Light-Emitting Diodes", J. Phys. Chem. Lett. 2015, 6, pp. 4360-4364.*
Brittman et al., "The Expanding World of Hybrid Perovskites: Materials Properties and Emerging Publications," MRS Communicaitons, 2015, 5:7-26.
Li et al., "Efficient Light-Emitting Diodes Based on Nanocrystalline Perovskite in a Dielectric Polymer Matrix," American Chemical Society, 2015, 2640-2644.
Li et al., "Single-Layer Light-Emitting Diodes Using Organometal Halide Perovskit/Poly(ethylene oxide) Composite Thin Films," Adv. Mater., 2015, 27:5196-5202.

(Continued)

*Primary Examiner* — Cuong Q Nguyen
*Assistant Examiner* — Tong-Ho Kim
(74) *Attorney, Agent, or Firm* — Eversheds Sutherland (US) LLP

(57) ABSTRACT

Provided herein are all-inorganic perovskite-based films, devices including all-inorganic perovskite-based films, and methods of forming all-inorganic perovskite-based films. The methods may include casting a precursor formulation that includes an all-inorganic perovskite, a liquid, and a polymer. The amount of polymer in the precursor formulation may be less than the amount of all-inorganic perovskite in the precursor formulation.

15 Claims, 14 Drawing Sheets

(56) References Cited

OTHER PUBLICATIONS

Kulbak et al., "How Important is the Organic Part of Lead Halide Perovskite Photovoltaic Cells? Efficient CsPbBr3 Cells," J Phys. Chem. Lett., 2015, 6:2452-2456.
Protesecu et al., "Nanocrystals of Cesium Lead Halide Perovskites (CsPbX3, X= Cl, Br, and I): Novel Optoelectronic Materials Showing Bright Emission with Wide Color Gamut," American Chemical Society, 2015, 3692-3696.
Tan et al., "Bright Light-Emitting Diodes Based on Organometal Halide Perovskite," Nature Nanotechnology, 2014, 3:687-692.
Yang et al., "High-Performance Photovoltaic Perovskite Layers Fabricated Through Intramolecular Exchange," Science, 2015, 348(6240)1234-1237.
Yantara et al., "Inorganic Halide Perovskites for Efficient Lilght-Emitting Diodes," J. Phys. Chem. Left., 2015, 6:4360-4364.

\* cited by examiner

ALL-INORGANIC PEROVSKITE-BASED FILMS, DEVICES, AND METHODS

CROSS-REFERENCE TO RELATED APPLICATIONS

This application claims priority to U.S. Provisional Patent Application No. 62/370,441, filed Aug. 3, 2016, which is incorporated herein by reference.

BACKGROUND

Solution-processed halide perovskites are photoactive materials that may be used to produce low-cost and/or high-performance optoelectronics. For example, perovskite-based solar cells having efficiencies of at least 20%, and perovskite-based light emitting diodes (PeLEDs) having high brightness and tunable color across the entire visible range have been produced (see, e.g., Yang, W. S. et al., *Science* 2015, 348, 1234; and Tan, Z. K. et al., *Nat. Nanotechnol.* 2014, 9, 687). PeLEDs typically include organic-inorganic hybrid perovskites, such as $CH_3NH_3PbBr_3$, as emitters.

Due to concerns regarding the stability of organic-inorganic hybrid perovskites, all-inorganic halide perovskites, such as cesium lead bromide ($CsPbBr_3$), have been used as alternative emitters in PeLEDs (see, e.g., Brittman, S. et al., *MRS Commun.* 2015, 5, 7). In addition to a photoluminescence (PL) comparable to that of $CH_3NH_3PbBr_3$ (Protesescu, L. et al., *Nano Lett.* 2015, 15, 3692), cesium-based perovskites have exhibited higher thermal and chemical stability (see, e.g., Kulbak, M. et al., *J Phys. Chem. Lett.* 2015, 6, 2452).

Despite these advantages, the brightness and/or quantum efficiency of cesium-based PeLEDs remains limited. To improve the external quantum efficiency (EQE), $CsPbBr_3$ quantum dots have been created, which have exhibited higher PL efficiency owing to the surface passivation as well as better morphology in close-packed quantum dot films (see, e.g., Li, G. et al., *Nano Lett.* 2015, 15, 2640). However, organic capping ligands stabilizing the quantum dots typically suppress charge injection into the emitters, which can result in limited brightness, high turn-on voltage, or a combination thereof.

Although some $CsPbBr_3$ films have been attempted, the relatively low solubility of cesium bromide (CsBr) precursor in commonly used solvents typically makes it difficult to produce $CsPbBr_3$ films of suitable quality. Perovskite-based films that include a large amount of polymer as a host matrix for the perovskite crystallites also have been made, but the inclusion of the host matrix has not cured one or more of the foregoing disadvantages (see, e.g., J. Li, et al., *Adv. Mater.* 2015, 27, 5196). Due, at least in part, to substantial current leakage caused by incomplete surface coverage, the maximum brightness achieved with PeLEDs based on $CsPbBr_3$ films has been only 407 cd m$^{-2}$ with peak EQE of 0.008% (Yantara, N. et al., *J. Phys. Chem. Lett.* 2015, 6, 4360).

Therefore, methods and materials that overcome one or more of the foregoing disadvantages associated with all-inorganic perovskites are desirable, including methods that [1] reduce or eliminate the substantial current leakage that can occur when films of all-inorganic perovskites, such as $CsPbBr_3$, are used, [2] produce all-inorganic perovskite-based films having favorable physical and/or light emitting characteristics, and/or [3] produce films of all-inorganic perovskites that are stable at a variety of ambient conditions, which may include relatively high humidity.

BRIEF SUMMARY

Provided herein are films, PeLEDs, and methods of making films that address one or more of the foregoing disadvantages.

In one aspect, methods of making films that include an all-inorganic perovskite are provided. In some embodiments, the methods include providing a precursor formulation that includes an all-inorganic perovskite, a polymer, and a liquid, wherein the weight ratio of the polymer to the all-inorganic perovskite in the precursor formulation is about 0.02:1 to about 0.5:1; and casting the precursor formulation to form a film comprising the all-inorganic perovskite. The casting may be achieved by spin-casting. In some embodiments, the weight ratio of the polymer to the all-inorganic perovskite in the precursor formulation is about 0.05:1 to about 0.3:1. In some embodiments, the weight ratio of the polymer to the all-inorganic perovskite in the precursor formulation is about 0.065:1 to about 0.3:1.

In another aspect, light emitting diodes are provided that include an all-inorganic perovskite-based film. In some embodiments, the light emitting diodes include an anode; a cathode; and a light emitting layer arranged between the anode and the cathode, wherein the light emitting layer includes an all-inorganic perovskite-based film as provided herein. In some embodiments, the light emitting diode has a photoluminescence quantum yield of at least 50%, or at least 60%. In some embodiments, the light emitting diode has a luminance of at least 12000 cd m$^{-2}$. In some embodiments, the light emitting diode has an electroluminescent brightness and efficiency of at least 53000 cd m$^{-2}$ and 4%, respectively. The light emitting diode also may include at least one of an electron transport layer and a hole transport layer.

DETAILED DESCRIPTION

Figure 1:
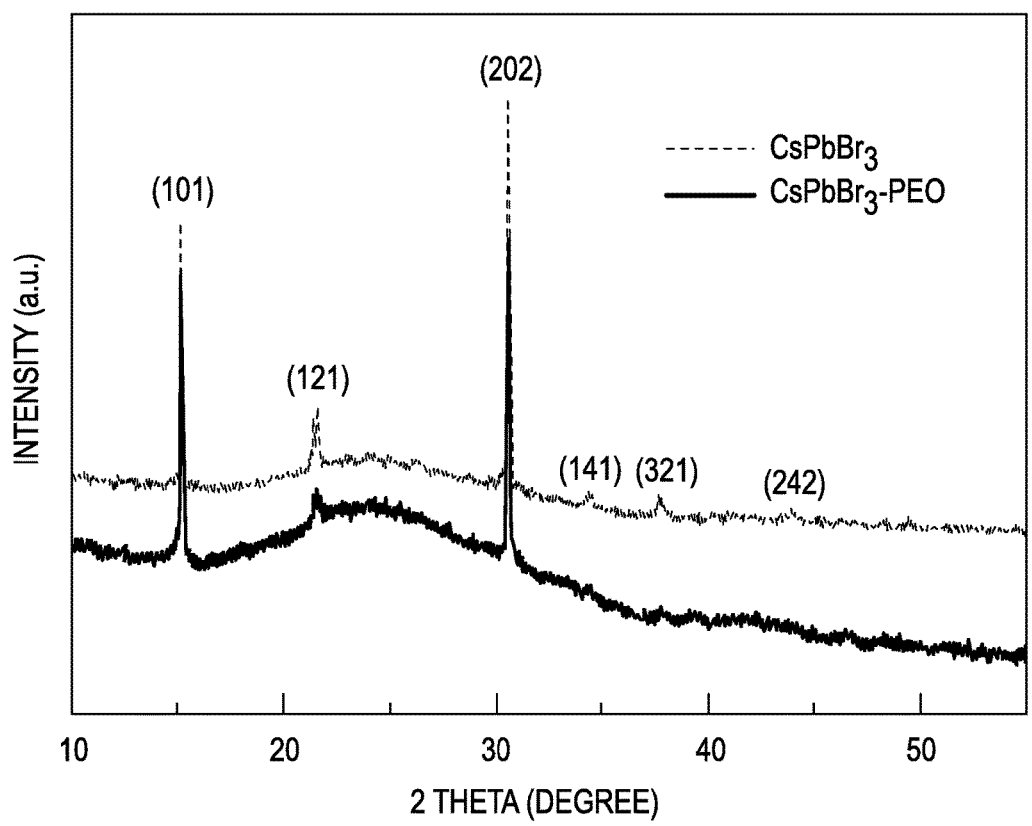
FIG. 1 depicts an X-ray diffraction (XRD) pattern of one embodiment of a $CsPbBr_3$ film with and without poly (ethylene oxide).

Provided herein are methods of forming all-inorganic perovskite-based films that [1] are substantially smooth, [2] are pinhole-free, [3] eliminate or reduce the current leakage of previous films and devices, [4] are stable at ambient conditions, including relatively high humidity, or [5] a combination thereof. Also provided herein are all-inorganic perovskite-based films and all-inorganic perovskite-based LEDs with improved brightness, EQE, or a combination thereof. In some embodiments, the films include CsPbBr$_3$ films having a photoluminescence quantum yield up to 60%, substantial uniformity of electrical current distribution, or a combination thereof. In some embodiments, PeLEDs that include the CsPbBr$_3$ films provided herein as emitting layers exhibit an electroluminescent brightness and efficiency above 53000 cd m$^{-2}$ and 4%, respectively.

One or more of these features may be achieved by forming an all-inorganic perovskite-based thin film from a precursor formulation that includes a polymer and an all-inorganic perovskite at a weight ratio (polymer:all-inorganic perovskite) of about 0.02:1 to about 0.5:1. The amount of polymer present in the precursor formulations herein is not sufficient for the polymer to serve as a matrix material. Not wishing to be bound by any particular theory, it is believed that the addition of a relatively small amount of the polymer may limit the diffusion of the all-inorganic perovskite, thereby facilitating or promoting the formation of small crystal domains, low surface roughness, and/or a pin-hole free structure of the perovskite films. As a result, at least one of the optical luminescent efficiency and the electrical current uniformity may be improved.

Methods of Forming Films

Provided herein are methods of forming an all-inorganic perovskite-based film. As used herein, the phrase "all-inorganic perovskite-based film" is a sheet-shaped material that includes an all-inorganic perovskite. In some embodiments, the all-inorganic perovskite-based films are thin films, which have a thickness of about 10 nm to about 1 mm.

In some embodiments, the methods of forming an all-inorganic perovskite-based film include providing a precursor formulation that includes an all-inorganic perovskite, a polymer, and a liquid; and casting the precursor formulation to form the all-inorganic perovskite-based film.

As used herein, the phrase "all-inorganic perovskite" refers to a perovskite material that does not include one or more carbon atoms. In some embodiments, the "all-inorganic perovskite" is a metal halide perovskite. A metal halide perovskite may include one or more metal atoms of the same element or different elements, and two or more halide ions selected from chloride, iodide, fluoride, or a combination thereof. In some embodiments, the all-inorganic perovskite includes a unit cell having the following formula:

CsPbX$_3$, wherein X is selected from Cl, Br, I, or a combination thereof.

In some embodiments, the all-inorganic perovskite is CsPbBr$_3$.

In some embodiments, an all-inorganic perovskite is soluble in the liquid of the precursor formulations. An all-inorganic perovskite is soluble in the liquid of the precursor formulations when the all-inorganic perovskite has a solubility greater than 95%, preferably greater than 99%, when measured in the liquid at 20° C.

Generally, the polymer of a precursor formulation may be any polymer that does not undesirably impact the formation of a film, the performance of a film, or a combination thereof. As used herein, the term "polymer" refers to a compound formed by covalently bonding together two or more monomers, which may have the same chemical structure or different chemical structures. Therefore, the term "polymer," as used herein, encompasses linear, branched, star, dendritic, comb, and/or crosslinked polymers, co-polymers, oligomers, etc.

In some embodiments, a polymer is soluble in the liquid of the precursor formulations. A polymer is soluble in the liquid of the precursor formulations when the polymer has a solubility greater than 95%, preferably greater than 99%, when measured in the liquid at 20° C.

In some embodiments, the polymer has a weight average molecular weight of about 100,000 g/mol to about 8,000,000 g/mol, about 200,000 g/mol to about 8,000,000 g/mol, about 300,000 g/mol to about 8,000,000 g/mol, about 400,000 g/mol to about 8,000,000 g/mol, about 500,000 g/mol to about 8,000,000 g/mol, about 600,000 g/mol to about 8,000,000 g/mol, about 1,000,000 g/mol to about 8,000,000 g/mol, about 1,000,000 g/mol to about 7,000,000 g/mol, about 1,000,000 g/mol to about 6,000,000 g/mol, about 1,000,000 g/mol to about 5,000,000 g/mol, or about 1,000,000 g/mol to about 4,000,000 g/mol. In some embodiments, the polymer has a weight average molecular weight of about 600,000 g/mol.

In some embodiments, a polymer is soluble in the liquid of the precursor formulations, and has a weight average molecular weight of about 100,000 g/mol to about 8,000,000 g/mol, about 200,000 g/mol to about 8,000,000 g/mol, about 300,000 g/mol to about 8,000,000 g/mol, about 400,000 g/mol to about 8,000,000 g/mol, about 500,000 g/mol to about 8,000,000 g/mol, about 600,000 g/mol to about 8,000,000 g/mol, about 1,000,000 g/mol to about 8,000,000 g/mol, about 1,000,000 g/mol to about 7,000,000 g/mol, about 1,000,000 g/mol to about 6,000,000 g/mol, about 1,000,000 g/mol to about 5,000,000 g/mol, or about 1,000,000 g/mol to about 4,000,000 g/mol. In some embodiments, the polymer is soluble in the liquid of the precursor formulations, and has a weight average molecular weight of about 600,000 g/mol.

In some embodiments, the polymer of the precursor formulations includes a polyether. As used herein, the term "polyether" generally refers to a polymer including a monomer according to formula (I):

wherein R$^1$ is a divalent C$_1$-C$_5$ hydrocarbyl. In some embodiments, R$_1$ is a divalent, unsubstituted C$_2$ hydrocarbyl, and the polymer includes poly(ethylene oxide). In some embodiments, R$_1$ is a divalent, unsubstituted C$_3$ hydrocarbyl, and the polymer includes poly(propylene oxide). In some embodiments, the polymer of the precursor formulations includes a monomer according to formula (I), such as poly(ethylene oxide) and/or poly(propylene oxide), and the polymer is soluble in the liquid of the precursor formulations. In some embodiments, the polymer of the precursor formulations includes a monomer according to formula (I), such as poly(ethylene oxide) and/or poly(propylene oxide), the polymer is soluble in the liquid of the precursor formulations, and the polymer has a weight average molecular weight of about 100,000 g/mol to about 8,000,000 g/mol, about 200,000 g/mol to about 8,000,000 g/mol, about 300,000 g/mol to about 8,000,000 g/mol, about 400,000 g/mol to about 8,000,000 g/mol, about 500,000 g/mol to about 8,000,000 g/mol, about 600,000 g/mol to about 8,000,000 g/mol, about 1,000,000 g/mol to about 8,000,000 g/mol, about 1,000,000 g/mol to about 7,000,000 g/mol, about 1,000,000 g/mol to about 6,000,000 g/mol, about 1,000,000 g/mol to about 5,000,000 g/mol, about 1,000,000 g/mol to about 4,000,000 g/mol, or about 600,000 g/mol.

In some embodiments, the polymer of the precursor formulations includes a polyacrylate. As used herein, the term "polyacrylate" generally refers to a polymer including a monomer according to formula (II):

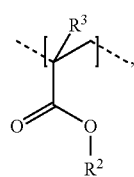

(II)

wherein $R^2$ is a monovalent $C_1$-$C_3$ hydrocarbyl, and $R^3$ is hydrogen or a monovalent $C_1$ hydrocarbyl. In some embodiments, $R^2$ is a monovalent, unsubstituted $C_1$ hydrocarbyl, $R^3$ is an unsubstituted monovalent $C_1$ hydrocarbyl, and the polymer includes poly(methyl methacrylate) (PMMA). In some embodiments, the polymer of the precursor formulations includes a monomer according to formula (II), such as PMMA, and the polymer is soluble in the liquid of the precursor formulations. In some embodiments, the polymer of the precursor formulations includes a monomer according to formula (II), such as PMMA, the polymer is soluble in the liquid of the precursor formulations, and the polymer has a weight average molecular weight of about 100,000 g/mol to about 8,000,000 g/mol, about 200,000 g/mol to about 8,000,000 g/mol, about 300,000 g/mol to about 8,000,000 g/mol, about 400,000 g/mol to about 8,000,000 g/mol, about 500,000 g/mol to about 8,000,000 g/mol, about 600,000 g/mol to about 8,000,000 g/mol, about 1,000,000 g/mol to about 8,000,000 g/mol, about 1,000,000 g/mol to about 7,000,000 g/mol, about 1,000,000 g/mol to about 6,000,000 g/mol, about 1,000,000 g/mol to about 5,000,000 g/mol, or about 1,000,000 g/mol to about 4,000,000 g/mol.

Generally, the liquid of the precursor formulations may be any liquid that does not undesirably impact the methods described herein. The liquid may include a single liquid or a combination of two or more liquids. In some embodiments, the liquid includes an organic liquid. In some embodiments, the liquid includes a polar liquid. In some embodiments, the liquid includes an organic polar liquid. In some embodiments, the liquid includes an aprotic liquid. In some embodiments, the liquid includes an organic aprotic liquid. In some embodiments, the liquid includes an organic polar aprotic solvent. In some embodiments, the liquid includes dimethyl sulfoxide (DMSO). In some embodiments, the liquid includes DMSO, acetone, N,N-dimethylformamide (DMF), acetonitrile, or a combination thereof.

In some embodiments, the all-inorganic perovskite, the polymer, or a combination thereof is soluble in the liquid. When at least one of the all-inorganic perovskite and the polymer is soluble in the liquid, the precursor formulations may include at least an amount of the liquid sufficient to dissolve the soluble component(s). In some embodiments, the polymer is soluble in the liquid, and the liquid is present in the precursor formulation at an amount sufficient to dissolve the polymer. In some embodiments, the polymer and the all-inorganic perovskite are soluble in the liquid, and the liquid is present in the precursor formulation at an amount sufficient to dissolve the polymer and the all-inorganic perovskite.

The amount of all-inorganic perovskite in the precursor solutions provided herein may exceed the amount of the polymer, thereby preventing the polymer from serving as a matrix material in the resulting films. In some embodiments, the weight ratio of the polymer to the all-inorganic perovskite in the precursor formulation is about 0.01:1 to about 0.5:1; about 0.02:1 to about 0.5:1; about 0.02:1 to about 0.4:1; about 0.02:1 to about 0.3:1; about 0.03:1 to about 0.3:1; about 0.05:1 to about 0.3:1; about 0.06:1 to about 0.3:1; about 0.065:1 to about 0.3:1; about 0.065:1 to about 0.26:1; about 0.065:1 to about 0.095:1; about 0.080:1 to about 0.090:1; or about 0.086:1. Not wishing to be bound by any particular theory, it is believed that the addition of a relatively small amount of the polymer may limit the diffusion of the all-inorganic perovskite, thereby facilitating or promoting the formation of small crystal domains and/or low surface roughness in the films. In some embodiments, a film formed by the methods provided herein is at least substantially pinhole-free.

As used herein, the term "casting" generally refers to any step of forming a film from the precursor formulation, typically by separating a portion of the liquid from the all-inorganic perovskite and the polymer. The casting step may permit a film to be formed on any suitable substrate. The substrate may include a layer of a light emitting device, including, but not limited to, a charge transport layer, a blocking layer, an injection layer, an electrode, or a counter electrode. In some embodiments, the casting of the precursor formulation to form the all-inorganic perovskite-based film may include spin-casting the precursor formulation. Any known spin-casting technique may be used. In some embodiments, spin-casting is performed at a rate of about 2000 to about 4000 rpm for a time of about 45 seconds to about 75 seconds.

The methods described herein also may include annealing a film. Any known annealing technique may be used. In some embodiments, the annealing of a film removes substantially all of the liquid. The annealing may be performed at a temperature and for a time sufficient to remove substantially all of the liquid.

The methods described herein also may include washing a film. In some embodiments, a film is washed with an organic compound, such as an aromatic organic compound, for example, chlorobenzene. A washing step may be repeated at least once. Not wishing to be bound by any particular theory, it is believed that washing a film may reduce the amount of polymer in the film, draw at least a portion of a polymer to a surface of an all-inorganic perovskite, or a combination thereof.

Light Emitting Diodes (LEDs) and Films

Provided herein are all-inorganic perovskite-based films, and devices that include the all-inorganic perovskite-based films. The all-inorganic perovskite-based films may be a light emitting material in the devices. The devices may include light emitting diodes (LEDs). The LEDs may include an all-inorganic perovskite-based film, and the all-inorganic perovskite-based film may be a light emitting material in the device.

In some embodiments, the devices are light emitting diodes, which include an anode; a cathode; and a light emitting layer arranged between the anode and the cathode. The light emitting layer may include an all-inorganic perovskite-based film, as described herein.

In some embodiments, the light emitting diodes include an all-inorganic perovskite-based film as a light emitting material, and the light emitting material has a photoluminescence quantum yield of at least 50%, or at least 60%.

In some embodiments, the light emitting diodes include an all-inorganic perovskite-based film as a light emitting material, and the light emitting diode has a luminance of at least 12000 cd m$^{-2}$.

In some embodiments, the light emitting diodes include an all-inorganic perovskite-based film as a light emitting material, and the light emitting diode has an electroluminescent brightness and efficiency of at least 53000 cd m$^{-2}$ and 4%, respectively.

In some embodiments, the light emitting diodes include an all-inorganic perovskite-based film as a light emitting material, and the light emitting diode has a photoluminescence quantum yield of at least 50%, or at least 60%, a luminance of at least 12000 cd m$^{-2}$, and an electroluminescent brightness and efficiency of at least 53000 cd m$^{-2}$ and 4%, respectively.

The LEDs provided herein generally may have any known LED architecture or arrangement of layers. In some embodiments, the LEDs include at least one of an electron transport layer and a hole transport layer. Non-limiting examples of materials that may be used as or in the layers of an LED include poly(3,4-ethylenedioxythiophene):poly(styrenesulfonate) (PEDOT:PSS), and bathocuproine (BCP). In some embodiments, an anode of the LEDs includes indium tin oxide (ITO). In some embodiments, a cathode of the LEDs includes LiF/Al.

The phrases "$C_1$-$C_5$ hydrocarbyl", "$C_1$-$C_3$ hydrocarbyl, and the like, as used herein, generally refer to aliphatic, aryl, or arylalkyl groups containing 1 to 5, or 1 to 3 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having 1 to about 5 carbon atoms, or 1 to about 3 carbon atoms, etc. Examples of alkyl groups include, but are not limited to, methyl, ethyl, propyl, isopropyl, n-butyl, t-butyl, isobutyl, pentyl, and the like, including any heteroatom substituted derivative thereof. Cycloalkyl moieties may be monocyclic, and examples include cyclopropyl, cyclobutyl, cyclopentyl, and the like, including any heteroatom substituted derivative thereof.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl, ethyl, propyl, t-butyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), azo, carbamoyl (—NHC(O)O-alkyl- or —OC(O)NH-alkyl), carbamyl (e.g., CONH$_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —CCl$_3$, —CF$_3$, —C(CF$_3$)$_3$), heteroalkyl, isocyanate, isothiocyanate, nitrile, nitro, phosphodiester, sulfide, sulfonamido (e.g., SO$_2$NH$_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl-).

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of various embodiments, applicants in no way disclaim these technical aspects, and it is contemplated that the present disclosure may encompass one or more of the conventional technical aspects discussed herein.

The present disclosure may address one or more of the problems and deficiencies of known methods and processes. However, it is contemplated that various embodiments may prove useful in addressing other problems and deficiencies in a number of technical areas. Therefore, the present disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

In the descriptions provided herein, the terms "includes," "is," "containing," "having," and "comprises" are used in an open-ended fashion, and thus should be interpreted to mean "including, but not limited to." When methods and composite materials are claimed or described in terms of "comprising" various components or steps, the composite materials and methods can also "consist essentially of" or "consist of" the various components or steps, unless stated otherwise.

The terms "a," "an," and "the" are intended to include plural alternatives, e.g., at least one. For instance, the disclosure of "a polymer," "a liquid," "an all-inorganic perovskite", and the like, is meant to encompass one, or mixtures or combinations of more than one polymer, liquid, all-inorganic perovskite, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, all numerical end points of ranges disclosed herein are approximate. As a representative example, Applicant discloses, in some embodiments, that the weight ratio of the polymer to the all-inorganic perovskite in the precursor formulation is about 0.080:1 to about 0.090:1. This range should be interpreted as encompassing ratios of about 0.080:1 to about 0.090:1, and further encompasses "about" each of 0.081:1, 0.082:1, 0.083:1, 0.084:1, 0.085:1, 0.086:1, 0.087:1, 0.088:1, and 0.089:1, including any ranges and sub-ranges between any of these values.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Low-conductive grade PEDOT:PSS (1:6, conductivity of $1.33 \times 10^{-3}$ S cm$^{-1}$, CLEVIOS™ P VP AI 4083) was purchased from HERAEUS® Inc. Moderate-conductive grade PEDOT:PSS (1:1.6, conductivity of 1 S cm$^{-1}$, Product No. 483095), high-conductive grade PEDOT:PSS (<100 Ω/sq, Product No. 739324), cesium bromide (CsBr), lead bromide (PbBr$_2$), dimethyl sulfoxide (DMSO, anhydrous, >99.9%), bathocuproine (BCP, 99%), TPBi (99.9%), lithium fluoride (LiF, 99.995%), and aluminum (Al, evaporation slug, 99.999%) were purchased from Sigma-Aldrich Corporation. Pre-patterned ITO-coated glass substrates (20 Ω/sq) were purchased from the Film Devices Inc. All the chemicals except BCP were used without treatment. BCP was purified by sublimation before thermal evaporation.

Example 1—Synthesis of CsPbBr$_3$-Based Perovskite Films and Characterization Dimethyl sulfoxide (DMSO) solutions containing PEO (10 g/L) and CsPbBr$_3$ (0.3 M) were first prepared as stock solutions. Before spin coating, these two solutions were premixed to form transparent precursor formulations with different PEO:CsPbBr$_3$ weight ratios (from 0.065:1 to 0.259:1).

Perovskite films were prepared by spin casting the precursor formulations at 3000 rpm for 60 seconds in a nitrogen-filled glovebox. After spin coating, the films were annealed at 70° C. for 5 minutes to remove residual DMSO solvent. The annealing was performed on a hot plate.

The films were then solvent-washed. Pure chlorobenzene was dropped on the sample 30 seconds prior to a spin-drying process at 6000 rpm. This washing process was repeated for four times.

For neat CsPbBr$_3$ film synthesis, pure DMSO solutions of CsPbBr$_3$ (0.3 M) were used as the precursor for spin casting.

The X-ray diffraction (XRD) pattern showed that the films obtained in this example were dominated by orthorhombic (Pnma) CsPbBr$_3$, which was consistent with the films synthesized without PEO, as depicted at FIG. 1. Unlike halide perovskites containing methylammonium cations (CH$_3$NH$_3^+$), the as-prepared CsPbBr$_3$-PEO films of this example were remarkably stable in ambient environment (with relative humidity above 60%), which permitted material and device characterizations to be carried out in air without encapsulation.

The morphology of perovskite films of this example was improved by the addition of PEO. The weight ratio of PEO:CsPbBr$_3$ in the premixed precursor formulations contributed to the improvement. A CsPbBr$_3$-PEO film of this example exhibited high surface coverage when synthesized with a 0.086:1 ratio of PEO:CsPbBr$_3$, by weight. In AFM images, the film appeared exceptionally smooth without large crystallites.

Figure 2:
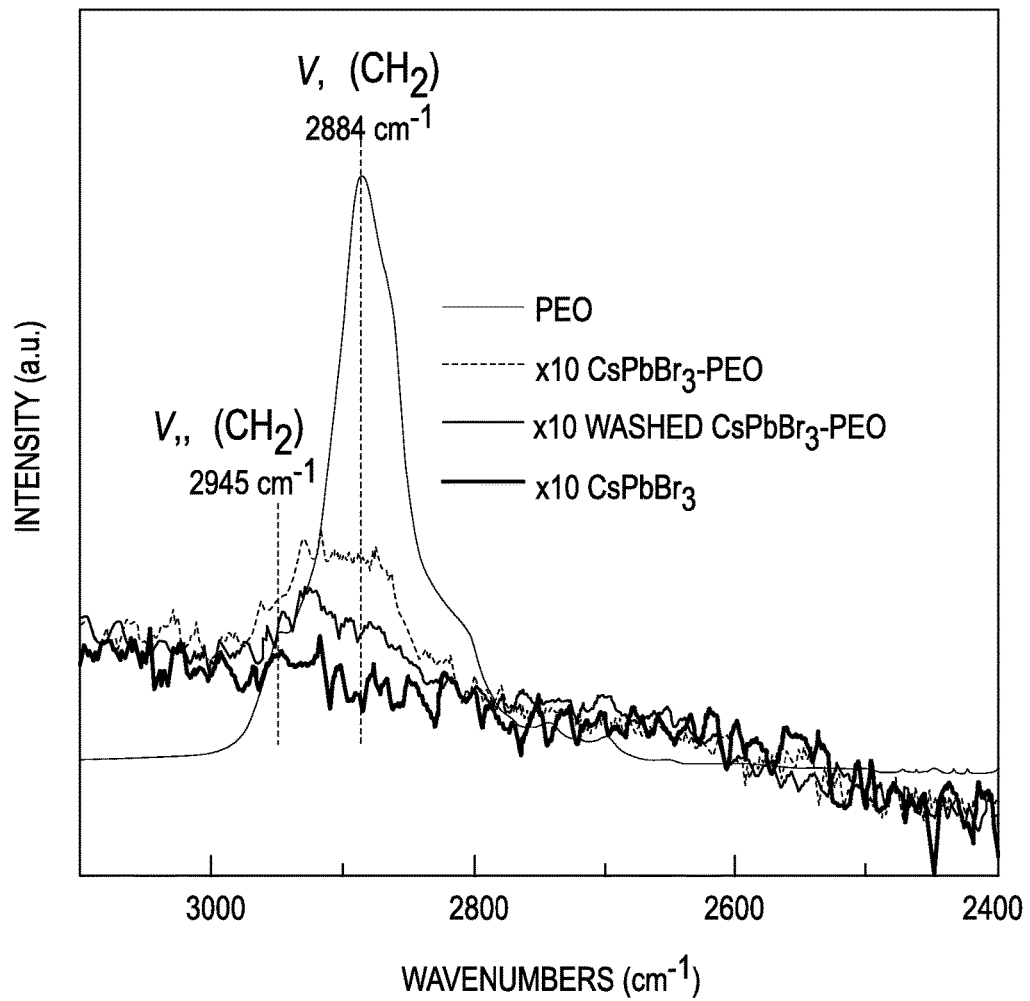
FIG. 2 depicts absorption spectra indicating the substantial absence of poly(ethylene oxide) in several embodiments of a film made according to the methods provided herein.

The XRD pattern of CsPbBr$_3$-PEO films of this example did not show the characteristic peak of PEO at ~19° (J. Li, et al., *Adv. Mater.* 2015, 27, 5196), which, in all likelihood, indicated that only a trace amount of PEO remained in the final product. The fact that only a small amount of PEO remained in the final product was further verified using attenuated total reflectance infrared spectroscopy (ATR-IR). While well-defined spectral features matching the symmetric ($V_s$) and asymmetric ($V_{as}$) stretching vibrational modes of CH$_2$ were observed between 2600 and 3000 cm$^{-1}$ in the IR spectrum taken from a pure PEO film, the CsPbBr$_3$-PEO film of this example exhibited very weak absorption, as depicted at FIG. 2. The amount of the PEO in CsPbBr$_3$-PEO films was further reduced, as depicted at FIG. 2, by washing the film in chlorobenzene, which indicated that the residual PEO was likely located at the surface of the microcrystalline CsPbBr$_3$ domains.

Figure 3:
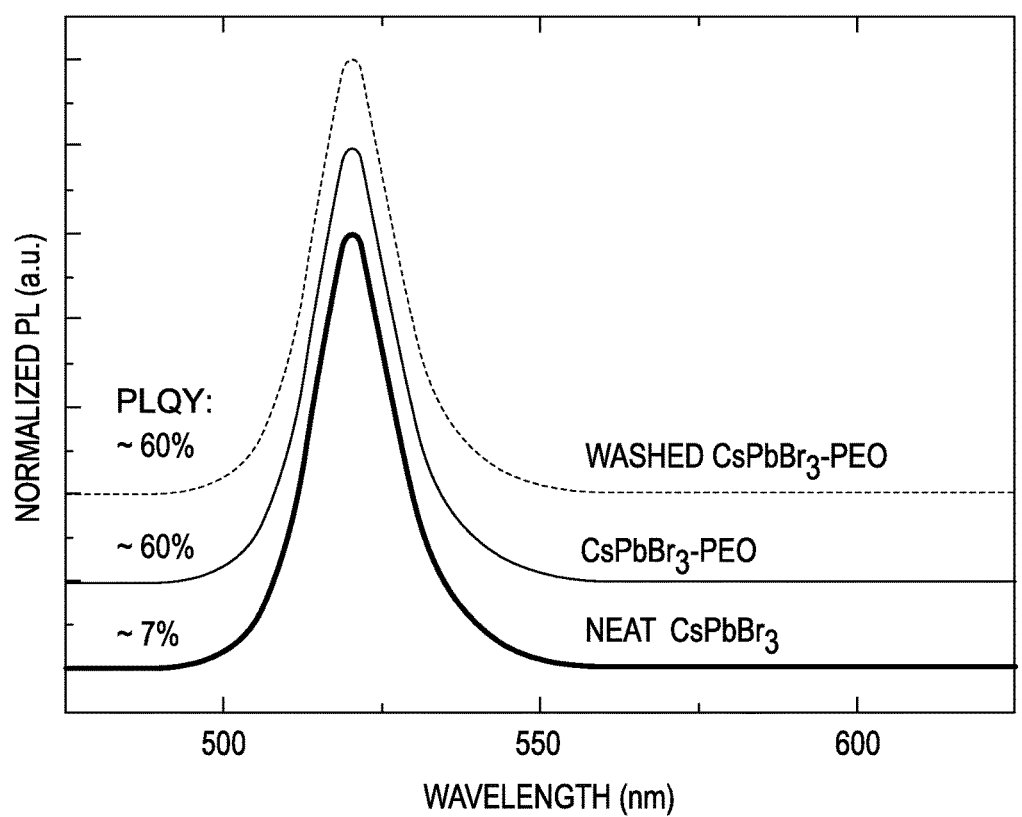
FIG. 3 depicts the quantum yield of different embodiments of films.

The CsPbBr$_3$ films of this example, which were synthesized with the PEO additive exhibited enhanced optical properties. While both CsPbBr$_3$-PEO and neat CsPbBr$_3$ (synthesized without PEO) showed an identical PL peak around 521 nm (corresponding to the direct bandgap ~2.4 eV (see, e.g., C. C. Stoumpos, et al., *Cryst. Growth Des.* 2013, 13, 2722), the PLQY of CsPbBr$_3$-PEO films was enhanced by an order of magnitude, reaching a value up to 60%, as depicted at FIG. 3.

Figure 4:
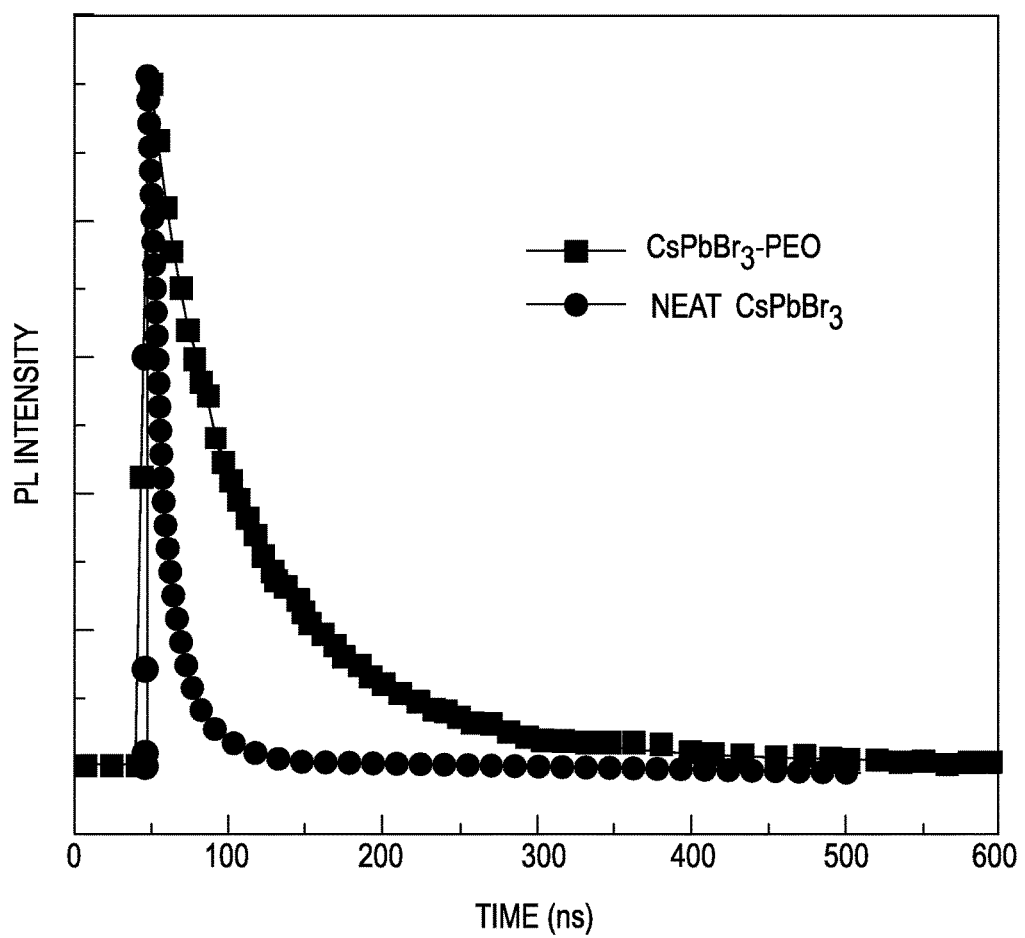
FIG. 4 depicts a comparison of the lifetime of two films, including one made by an embodiment of the methods provided herein.

It is believed that the PL enhancement of the CsPbBr$_3$-PEO films of this example was caused, at least in part, by the suppression of non-radiative decay, which likely resulted in a longer PL lifetime compared to that of neat CsPbBr$_3$ (see FIG. 4, $\tau_{ave}$~86 ns vs. 16 ns). This improvement in light emission could be attributed, at least in part, to the surface passivation from the PEO additive. Although the amount of residual PEO was further reduced in the washed CsPbBr$_3$-PEO films of this example, the PLQY remained nearly unchanged, as depicted at FIG. 3, which indicated that a very thin layer of surface-bound PEO may be sufficient, in some instances, for the purpose of surface passivation.

The improved morphology of the CsPbBr$_3$-PEO films of this example gave rise to advantageous electrical properties. Compared to neat CsPbBr$_3$, the grain size of the CsPbBr$_3$-PEO films of this example was reduced, which likely contributed, at least in part, to the formation of substantially pinhole-free films. By mapping local electrical current using conductive atomic force microscopy, high-conductivity channels distributed unevenly across neat CsPbBr$_3$ films were observed, which corresponded to the gaps between perovskite domains (i.e., pinholes). The integration of such electrically non-uniform films into PeLEDs likely would result in severe current leakage through the pinholes, thereby limiting the [1] charge injections into the light emitters (i.e. the perovskite domains), and/or [2] the current efficiency of the devices. The current of the neat CsPbBr$_3$ film of this example fluctuated by 5.89 pA.

In contrast, the current mapped on the CsPbBr$_3$-PEO films of this example demonstrated a more uniform distribution, which likely resulted from high surface coverage. While the electrical current was dominated by the pinholes in the neat CsPbBr$_3$, the current fluctuated by only 0.3 pA for an average current of 1.4 pA across the CsPbBr$_3$-PEO films of this example. The residual PEO was did not appear to substantially or unacceptably impact charge transport.

While some $CsPbBr_3$-PEO films washed with chlorobenzene in this example showed negligible variation in morphology, the electrical current seemed more evenly distributed after chlorobenzene washing, which may be attributed, at least in part, to the removal of slightly more conductive $CsPbBr_3$-PEO complexes at certain grain boundaries. However, such difference are not expected to alter the electrical properties of $CsPbBr_3$-PEO films substantially or undesirably, because the average current and the standard deviation in the current maps of the films of this example demonstrated minimal changes between the $CsPbBr_3$-PEO films before and after chlorobenzene washing.

Example 2—Fabrication of LED Device

The $CsPbBr_3$-PEO films of Example 1 were used as a light emitter in PeLEDs, which, as explained herein, were bright and efficient.

Figure 5:
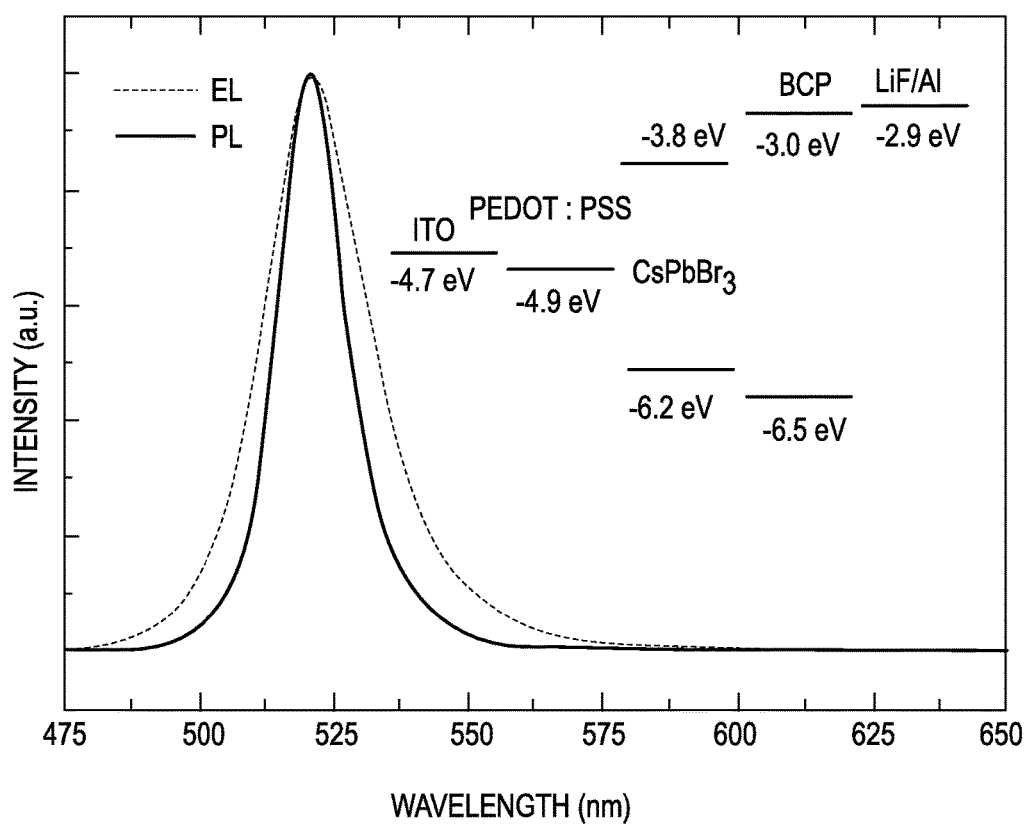
FIG. 5 depicts the intensity of several embodiments of LEDs, and an energy level diagram of one embodiment of a device.
Figure 6:
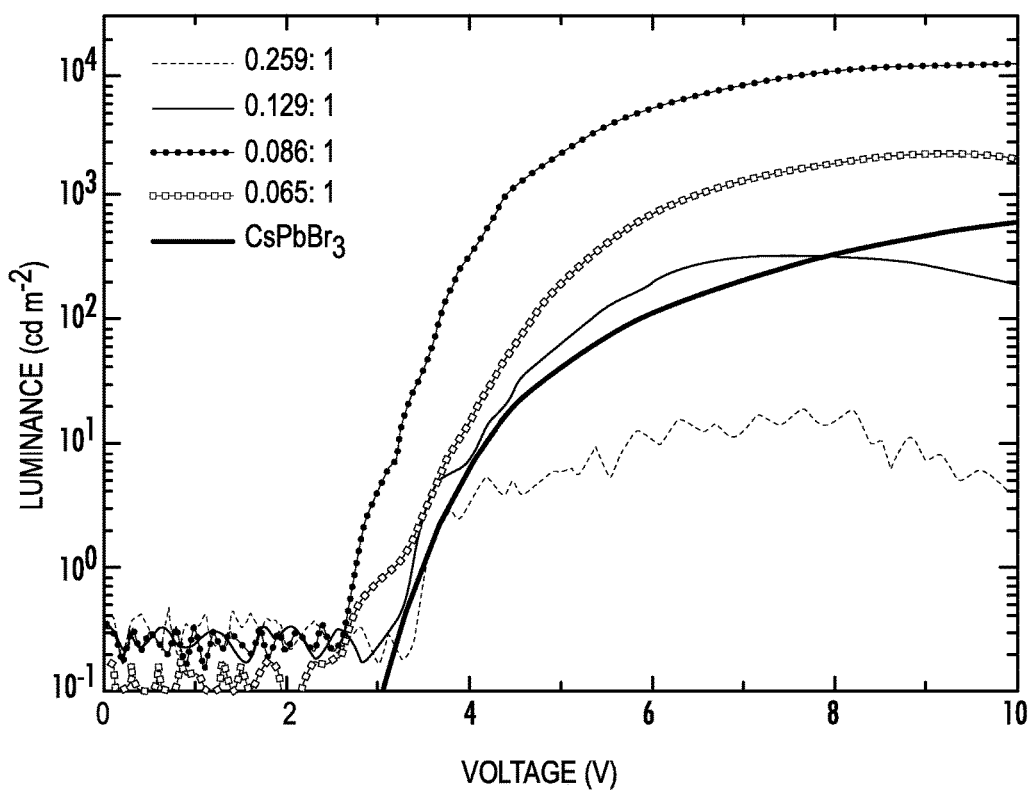
FIG. 6 depicts a plot of the luminescence of embodiments of LEDs.
Figure 7:
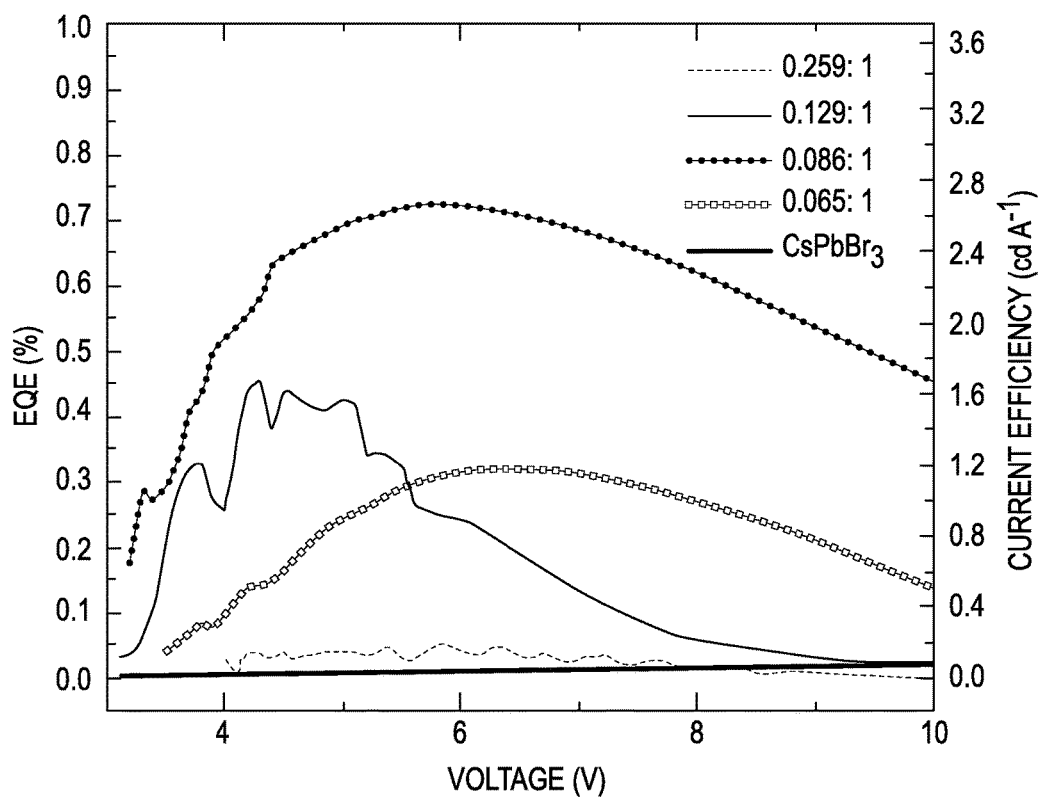
FIG. 7 depicts a plot of EQE-voltage of embodiments of LEDs.

The PeLEDs of this example had a layered architecture commonly found in OLEDs. The PeLEDs include indium tin oxide (ITO) as an anode, poly(3,4-thylenedioxythiophene): poly(styrenesulfonate) (PEDOT:PSS) as a hole-injection layer, bathocuproine (BCP) as electron transport and hole blocking layers, and LiF/Al as a cathode. While all the devices of this example emitted green electroluminescence with excellent color purity (FIG. 5, centered at 521 nm with FWHM of 21 nm), the PeLEDs based on the $CsPbBr_3$-PEO films of Example 1 outperformed the devices made of neat $CsPbBr_3$ by up to an order of magnitude in both brightness (FIG. 6) and EQE (FIG. 7).

Indium tin oxide (ITO)-coated glass substrates were cleaned sequentially by sonication in a 1% ALCONOX® precision cleaner solution (Alconox, Inc., USA), acetone, and isopropyl alcohol for 20 minutes followed by UV ozone treatment for 20 minutes prior to use.

PEDOT:PSS solutions were filtered before use by 5 μm or 0.45 μm polytetrafluoroethylene (PTFE) syringe filters (depending on their conductive grade). The PEDOT:PSS solutions were spin-coated onto the ITO-coated glass substrates at 3000 rpm for 60 seconds, following by annealing at 140° C. for 15 minutes in air.

After cooling, the substrates were transferred into a $N_2$-filled glove box and spin-coated with the $CsPbBr_3$ perovskite emissive layer of Example 1 at 3000 rpm for 60 seconds, followed by annealing at 70° C. for 5 minutes. The PEO of the precursor formulations of Example 1 resulted in smooth and pinhole-free perovskite emitting layers, which were obtained with small crystal domains.

Finally, BCP or TPBi (40 nm), LiF (1 nm) and Al (100 nm) layers were deposited sequentially using thermal evaporation through shadow masks at rates of 1.0 Å $s^{-1}$, 0.1 Å $s^{-1}$, and 4 Å $s^{-1}$, respectively, under high vacuum (<$3 \times 10^{-6}$ Torr). The PeLEDs were formed at the 2×2 mm squares where the ITO (anode) and Al (cathode) stripes intersected.

The $CsPbBr_3$-PEO films prepared using the method of this example exhibited improvement in both photoluminescence quantum yield (PLQY) and uniformity of current distribution. When used as emitters, the $CsPbBr_3$-PEO films made according to the methods of Example 1 and 2 exhibited a brightness and EQE in green PeLEDs of 53525 cd $m^{-2}$ and 4.26%, respectively. A comparison of the performance of the devices of this example with other various devices is provided in the following table:

TABLE 1

Comparisons of representative green PeLEDs.

| Perovskite Emitter | EL peak (nm) | Device architecture | $V_T$ [V] | Max Lu [cd $m^{-2}$] | Max EQE [%] | Max CE [cd $A^{-1}$] | Ref. |
| --- | --- | --- | --- | --- | --- | --- | --- |
| $CsPbBr_3$ film | 521 | ITO/PEDOT:PSS/ $CsPbBr_3$/TPBi/LiF/Al | 2.5 | 53525 | 4.26 | 15.67 | Examples 1 and 2 |
| $CsPbBr_3$ QD | 516 | ITO/PEDOT:PSS/PVK/ $CsPbBr_3$/TPBi/LiF/Al | 4.2 | 946 | 0.12 | 0.43 | 1 |
| $CsPbBr_3$ QD | 516 | ITO/PEDOT:PSS/poly-TPD/ PEI/$CsPbBr_3$/TPBi/LiF/Al | 3.5 | 1377 | 0.06 | 0.19 | 2 |
| $CsPbBr_3$ QD | 523 | ITO/ZnO/$CsPbBr_3$/TFB/$MoO_3$/Ag | 2.6 | 2335 | 0.19 | 0.75 | 3 |
| $CsPbBr_3$ QD | 527 | ITO/PEDOT:PSS/$CsPbBr_3$/ TPBi/LiF/Al | 4.6 | 3853 | 2.21 | 8.98 | 4 |
| $CsPbBr_3$ film | 527 | ITO/PEDOT:PSS/$CsPbBr_3$/ F8/Ca/Ag | 3 | 407 | 0.008 | 0.035 | 5 |
| $CH_3NH_3PbBr_3$ film | 540 | Glass/PEDOT:PSS:PFI/ $CH_3NH_3PbBr_3$/TPBi/LiF/Al | 4 | 15000 | 8.53 | 42.0 | 6 |
| $CH_3NH_3PbBr_3$ film | 545 | ITO/PEO-$CH_3NH_3PbBr_3$/ Ag NWs | 2.6 | 21014 | 1.1 | 4.91 | 7 |
| $CH_3NH_3PbBr_3$ film | 524 | ITO/PEDOT:PSS/ $CH_3NH_3PbBr_3$/TPBi/CsF/Al | 2.9 | 2503 | 1.1 | 4.5 | 8 |

EL-electroluminescence, $V_T$-turn-on voltage, Lu-luminance, CE-current efficiency, QD-quantum dot

REFERENCES

[1] J. Song, J. Li, X. Li, L. Xu, Y. Dong, H. Zeng, *Adv. Mater.* 2015, 27, 7162; [2] X. Zhang, H. Lin, H. Huang, C. Reckmeier, Y. Zhang, W. C. H. Choy, A. L. Rogach, *Nano Lett.* 2016, 16, 1415; [3] G. Li, F. W. R. Rivarola, N. J. L. K. Davis, S. Bai, T. C. Jellicoe, F. de la Peña, S. Hou, C. Ducati, F. Gao, R. H. Friend, N. C. Greenham, Z.-K. Tan, *Adv. Mater.* 2016, 28, 3528; [4] X. Zhang, B. Xu, J. Zhang, Y. Gao, Y. Zheng, K. Wang, X. W. Sun, *Adv. Funct. Mater.* 2016, DOI: 10.1002/adfm.201600958; [5] N. Yantara, S. Bhaumik, F. Yan, D. Sabba, H. A. Dewi, N. Mathews, P. P. Boix, H. V. Demir, S. Mhaisalkar, *J. Phys. Chem. Lett.* 2015, 6, 4360; [6] H. Cho, S.-H. Jeong, M.-H. Park, Y.-H. Kim, C. Wolf, C.-L. Lee, J. H. Heo, A. Sadhanala, N. Myoung, S. Yoo, S. H. Im, R. H. Friend, T.-W. Lee, *Science* 2015, 350, 1222; [7] S. G. R. Bade, J. Li, X. Shan, Y. Ling, Y. Tian, T. Dilbeck, T. Besara, T. Geske, H. Gao, B. Ma, K. Hanson, T. Siegrist, C. Xu, Z. Yu, *ACS Nano* 2016, 10, 1795; and [8] H. Huang, F. Zhao, L. Liu, F. Zhang, X.-g. Wu, L. Shi, B. Zou, Q. Pei, H. Zhong, *ACS Appl. Mater. Interfaces* 2015, 7, 28128.

Figure 8:
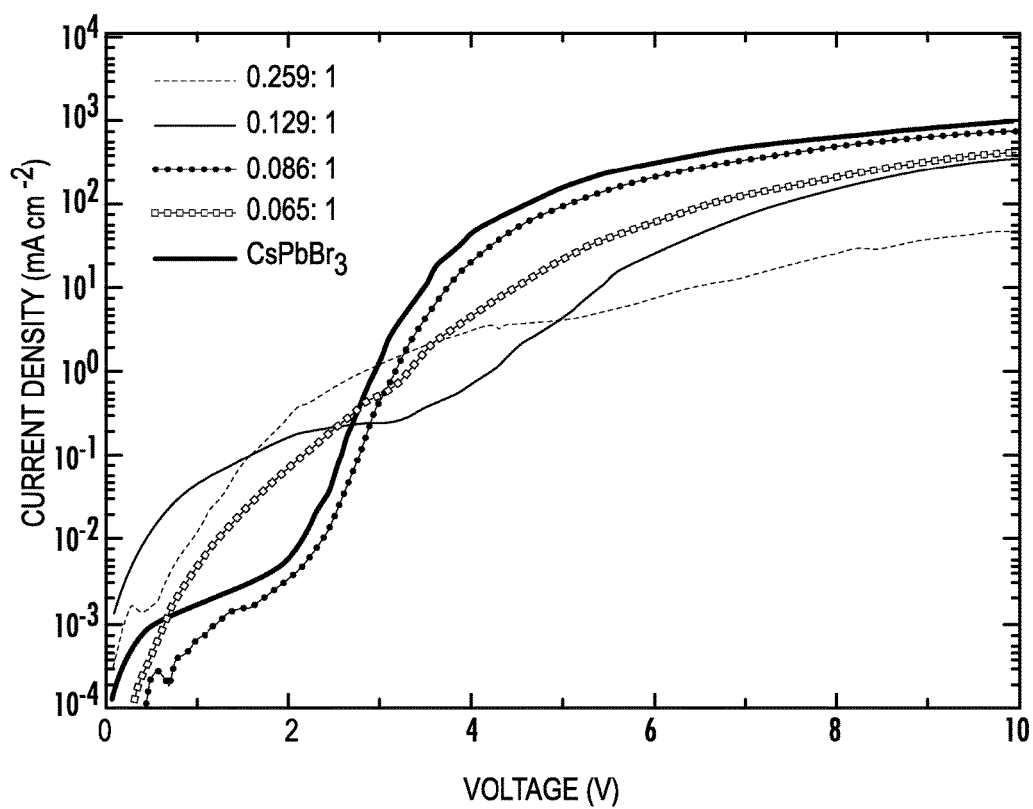
FIG. 8 depicts a plot of current density of embodiments of LEDs.

Consistent with the comparisons of intrinsic optical and electrical properties between the $CsPbBr_3$ films of Example 1, which were synthesized with and without PEO, the enhanced device performance likely could be attributed to the improvement in both PLQY and current distribution. The correlation between film quality and device performance also was observed among the perovskite films synthesized with different $PEO:CsPbBr_3$ weight ratios (FIG. 6, FIG. 7, and FIG. 8).

Maximum luminance greater than 12000 cd m$^{-2}$ was achieved in PeLEDs containing the film of Example 1 synthesized with a 0.086:1 weight ratio of $PEO:CsPbBr_3$. Because of the uniform current density expected from pinhole-free surface coverage, the film morphology likely suppressed the current leakage (reflected as the lower current below the device turn-on voltage, FIG. 8). This result was consistent with the current mapped using PeakForce TUNA™, which demonstrated that the PEO additive of Example 1 produced $CsPbBr_3$-PEO films with improved uniformity in electrical conductivity. These comparisons indicate that the performance of PeLEDs was enhanced by the optimized film morphology achieved using the PEO-assisted synthesis of $CsPbBr_3$ films of Example 1.

Figure 9:
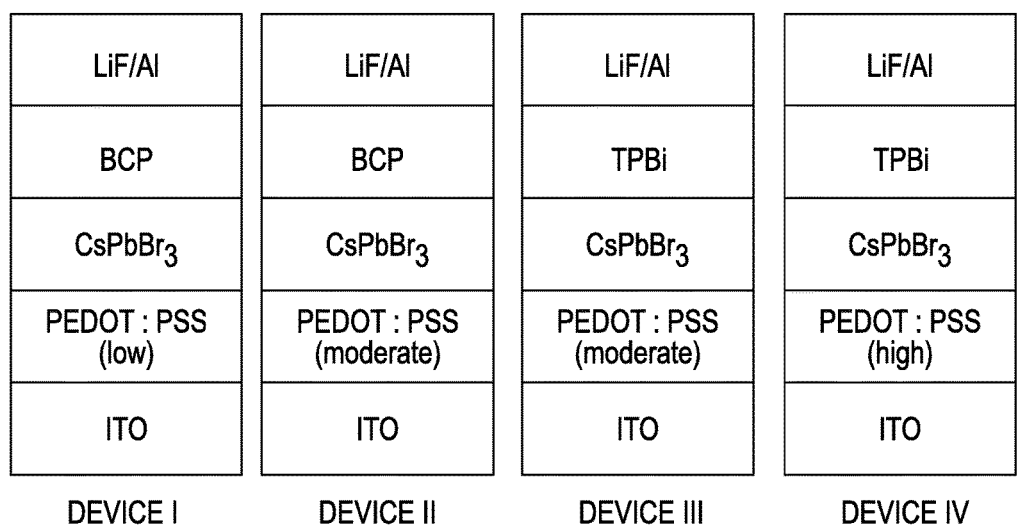
FIG. 9 depicts schematics of various embodiments of LED arrangements.
Figure 10:
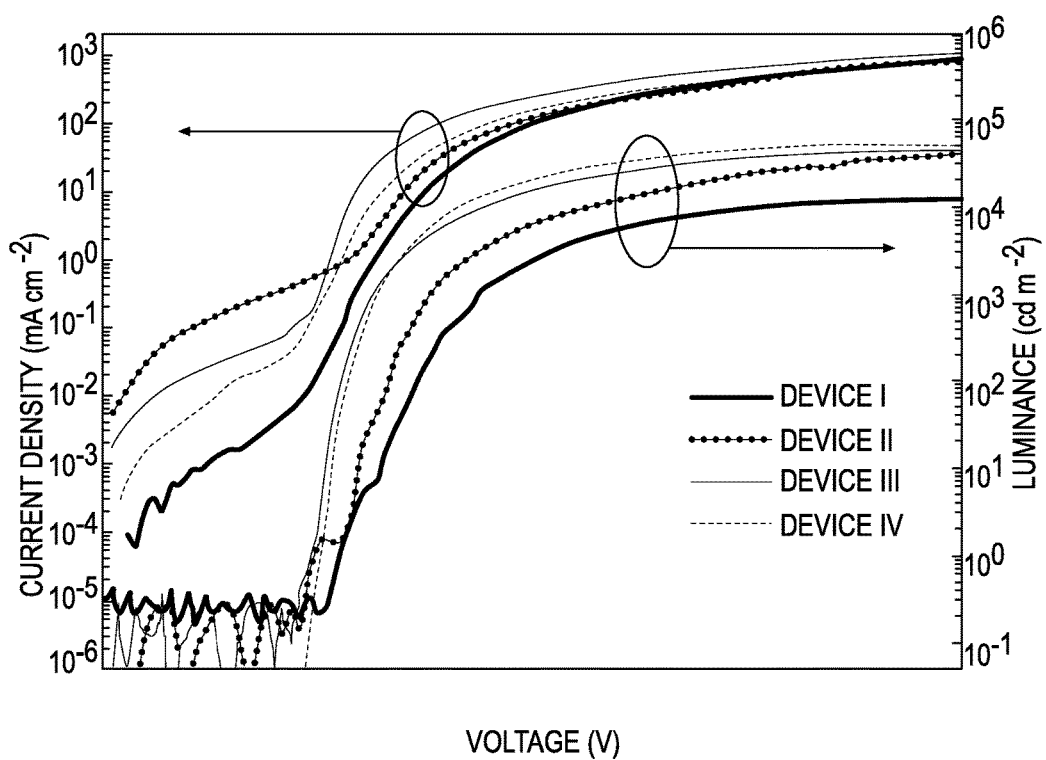
FIG. 10 depicts plots of current density and luminescence of various embodiments of LED devices.
Figure 11:
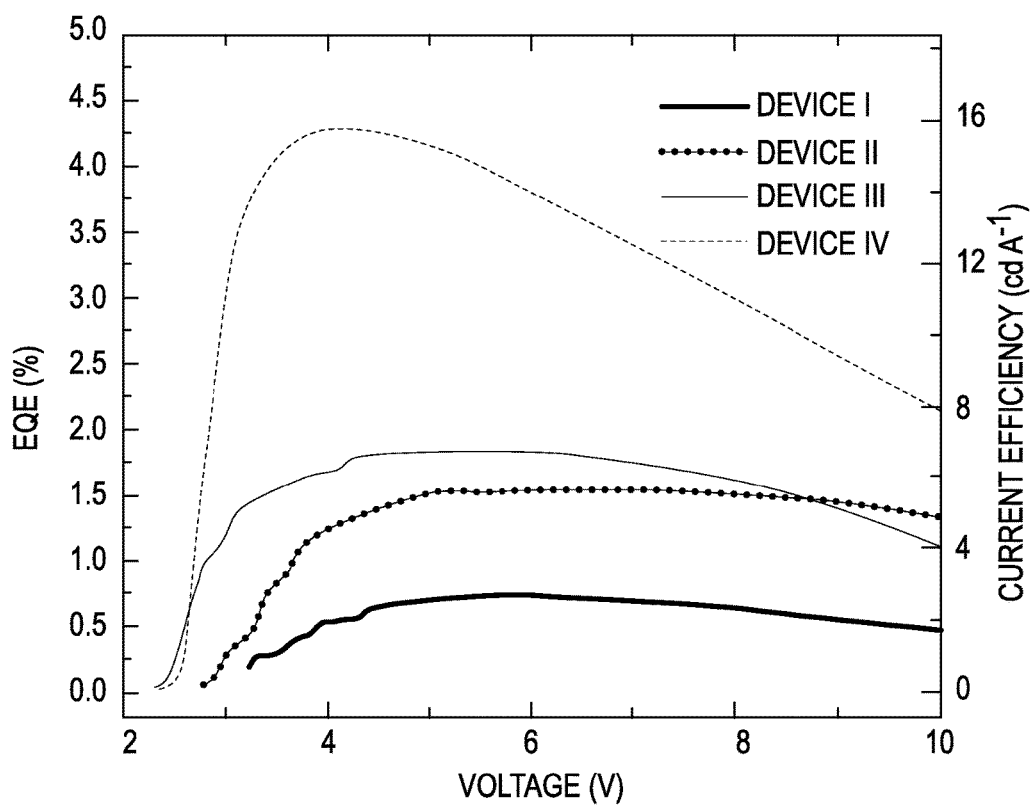
FIG. 11 depicts plots of EQE and current efficiency of various embodiments of LED devices.

Due to the relatively poor electronic conductivity of PEO, the effect of the trace amount of residual PEO in the perovskite films of this example was tested to determine whether it altered the efficiencies and the balance (electrons vs. holes) of charge injections into the perovskite emitters when integrated into PeLEDs. These changes were observed as the differences in the current-voltage (I-V) relations of the PeLEDs, as depicted at FIG. 8. In order to circumvent this "side effect" and optimize the charge transport at the device level, $CsPbBr_3$-based LEDs using different electrons and holes transport layers (ETL and HTL) were constructed and compared according to the methods of this example, as depicted at FIG. 9. By replacing the HTL from low to high-conductivity PEDOT:PSS, progressive improvement was observed in both brightness and EQE, likely due to the more efficient conduction and injection of holes into the light emitting layer (i.e., the perovskite layer), as depicted at FIG. 10 and FIG. 11.

Conversely, the electron transport and injection did not appear to be a limiting factor in certain devices of this example. TPBi (2,2',2"-(1,3,5-Benzinetriyl)-tris(1-phenyl-1-H-benzimidazole)) has been more commonly used than BCP as the ETL in PeLED (see Table 1), likely due to its higher charge carrier mobility (8×10$^{-5}$ vs. 5.5×10$^{-6}$ cm$^2$ V$^{-1}$ S$^{-1}$). However, only marginal improvement was achieved when BCP was replaced with TPBi as the ETL; with TPBi (in device III & IV), the devices turn on at slightly lower voltage, maintained a higher current density and higher brightness at moderate voltage before driven towards saturation at 10 V, as depicted at FIG. 10.

Figure 12:
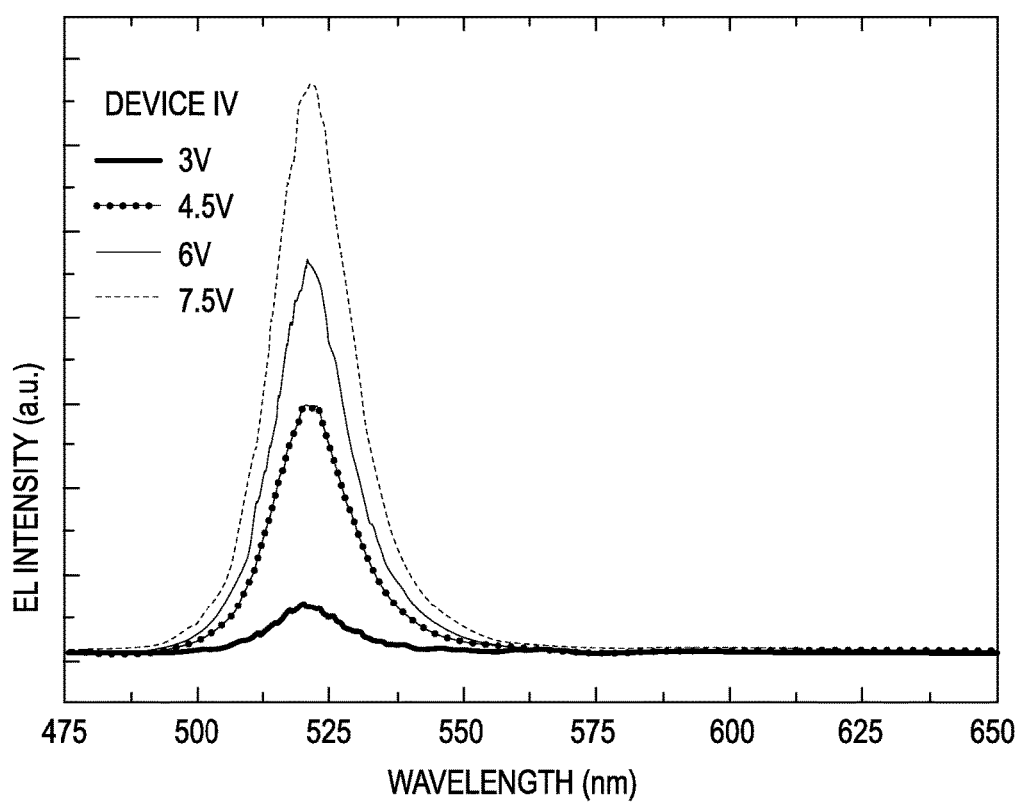
FIG. 12 depicts the EL intensity achieved with an embodiment of an LED device at different voltages.

With optimized charge carrier injection, certain devices of this example achieved the maximum luminance, EQE, and current efficiency (CE) of 53525 cd m$^{-2}$, 4.26%, and 15.67 cd A$^{-1}$, respectively (Table 2, device IV). As shown at Table 1, the device of this example was the most efficient LED based on $CsPbBr_3$, and the brightest among all the PeLEDs depicted at Table 1. Stable and uniform electroluminescence was visible to naked eyes at low driving voltage (3 V) and reached maximum brightness at 7.5 V (see FIG. 12).

TABLE 2

Device characteristics of $CsPbBr_3$-based PeLEDs of Example 2

| PEO:$CsPbBr_3$ w/w ratio | HTL: PEDOT: PSS grade | ETL | Turn-on voltages [V] | Max Luminance [cd m$^{-2}$] | Max EQE [%] | Max Current Efficiency [cd A$^{-1}$] |
|---|---|---|---|---|---|---|
| 0.259:1 | low | BCP | 3.6 | 19 | 0.0486 | 0.175 |
| 0.129:1 | low | BCP | 3.4 | 341 | 0.455 | 1.67 |
| 0.086:1 (I) | low | BCP | 2.8 | 12706 | 0.725 | 2.66 |
| 0.065:1 | low | BCP | 3.3 | 2337 | 0.318 | 1.17 |
| neat $CsPbBr_3$ | low | BCP | 3.5 | 666 | 0.019 | 0.070 |
| 0.086:1 (II) | moderate | BCP | 2.5 | 40689 | 1.55 | 5.68 |
| 0.086:1 (III) | moderate | TPBi | 2.5 | 43136 | 1.82 | 6.69 |
| 0.086:1 (IV) | high | TPBi | 2.5 | 53525 | 4.26 | 15.67 |

The PeLEDs of this example were highly bright and efficient. Not wishing to be bound by any particular theory, it is believed that higher material stability, along with comparable device performance, indicated that the all-inorganic cesium-based perovskites of this example can serve as a favorable alternative to organic-inorganic hybrid perovskites for LED applications. With the same device architecture, PeLEDs based on $CH_3NH_3PbBr_3$ degraded quickly in ambient conditions, while those based on the $CsPbBr_3$ film of this example exhibited stable luminance over repeated bias voltage scans (see Example 4).

Example 3—Characterization of Films and Devices

The $CsPbBr_3$ film on glass substrate of Example 2 was characterized by a PANanlytical™ X'PERT Pro powder X-ray diffractometer (PANalytical™, Almelo Netherlands). Diffraction patterns were recorded from 10 to 55° 2θ with a step size of 0.02° at 0.5° min$^{-1}$. The PL and EL spectra were measured using a HORIBA® iHR320 spectrometer, equipped with a HORIBA Synapse CCD (HORIBA® Scientific, USA). A 100 W mercury arc lamp coupled with a 420 nm long pass filter was used as the excitation light source. The electrical and optoelectronic characteristics of the devices were measured using a Keithly 4200 sourcemeter/multimeter coupled to a Thorlabs FDS 1010 Si photodiode (TEKTRONIX®, USA). Only light emission from the front face of the device was collected and used in subsequent efficiency calculations. The emission was found to be uniform throughout the area of each device.

PL quantum yield and time-resolved PL were characterized at room temperature using an EDINBURGH® FLS980 spectrometer (EDINBURGH® Instruments, USA). Samples were excited using light output from a housed 450 W Xe lamp passed through a single grating (1800 l/mm, 250 nm blaze) Czerny-Turner monochromator and finally a 5 nm bandwidth slit. Emission from the sample was first passed through a 495 nm long-pass color filter, then a single grating (1800 l/mm, 500 nm blaze) Czerny-Turner monochromator (5 nm bandwidth) and finally detected by a Peltier-cooled HAMAMATSU® R928 photomultiplier tube (HAMAMATSU®, Japan). The dynamics of emission decay were monitored by using the FLS980's time-correlated single-photon counting capability (1024 channels; 5 ms window) with data collection for 10000 counts. Excitation was provided by an EDINBURGH® EPL-405 picosecond pulsed diode laser (400.4 nm, 57.6 ps FWHM) operated at 200 kHz (EDINBURGH® Instruments, USA). Emission quantum yields were acquired using an integrating sphere incorporated into a spectrofluorometer (FLS980, EDINBURGH® Instruments, USA).

Quantum yields were then calculated by using the EDINBURGH® L980 software package (EDINBURGH® Instruments, USA). Attenuated total reflectance infrared (ATR-IR) spectra were recorded using a BRUKER® ALPHA® FTIR spectrometer (SiC Glowbar source, DTGS detector) with a Platinum ATR quickSnap sampling module (single reflection diamond crystal)(BRUKER®, USA). Spectra were obtained by placing dry, PEO, $CsPbBr_3$, and $CsPbBr_3$-PEO slides active side down on the diamond face, and data were acquired from 2400 to 3100 $cm^{-1}$ at a resolution of 1.4 $cm^{-1}$. All ATR-IR spectra were reported in absorbance with a blank versus atmosphere. Atomic force microscopy measurements were carried out in air under ambient conditions using a commercial scanning probe microscopy (BRUKER® Dimension Icon, equipped with PF-TUNA™ module)(BRUKER®, USA).

Topographic AFM images were taken by tapping mode. Distributions of electrical current through perovskite films were performed using platinum/Iridium coated silicon nitride tips (PeakForce-TUNA™ module) with a spring constant of 0.4 N/m and a tip radius of 25 nm. A current amplifier (TUNA™ module) was added to the system to measure the current signal while a constant bias voltage was applied to the sample substrate (BRUKER®, USA). During the measurements, a bias voltage of 1.5V was applied on the ITO substrates with the sample structure ITO/PEDOT:PSS/$CsPbBr_3$.

Example 4—Comparison of Stability Between PeLEDs Based on $CsPbBr_3$ and $CH_3NH_3PbBr_3$ A comparison of cesium-based perovskites and organic-inorganic hybrid perovskites (e.g. $CH_3NH_3PbBr_3$) was conducted.

PeLEDs having the same device architecture were fabricated using different perovskites ($CsPbBr_3$ and $CH_3NH_3PbBr_3$) as the emitting layer. The devices had the following architecture:

(ITO/PEDOT:PSS/perovskite/TPBi/LiF/Al).

Figure 13:
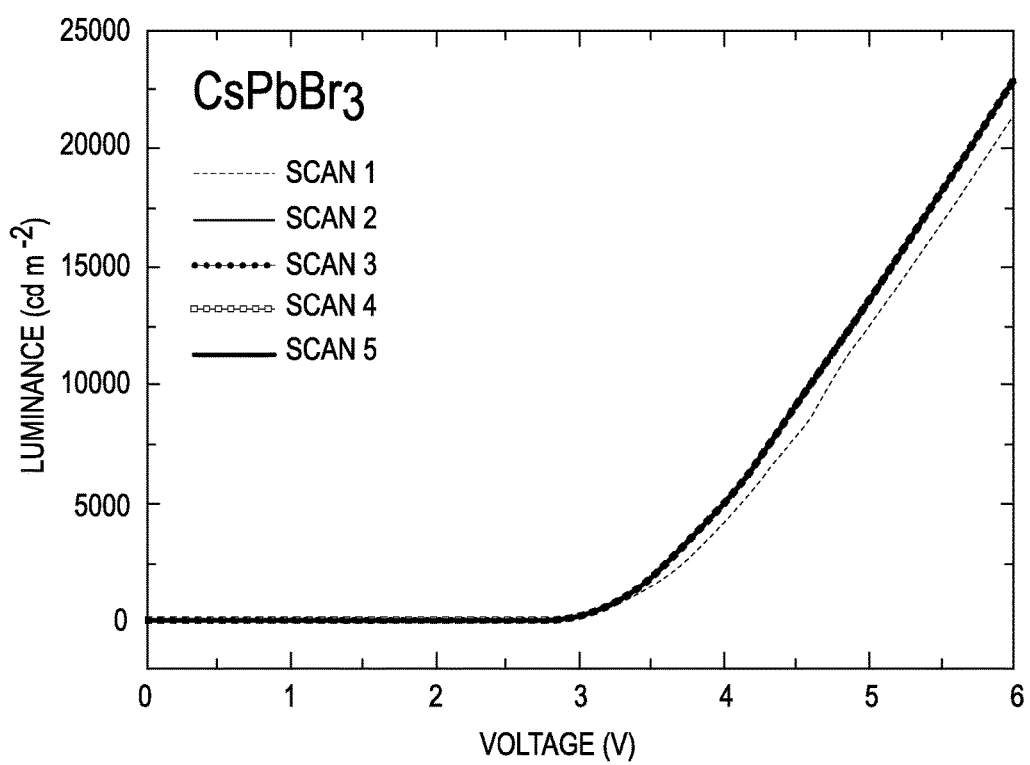
FIG. 13 depicts luminescence-voltage curves collected for an embodiment of a CsPbBr$_3$-based LED.

Without encapsulation, $CsPbBr_3$-based PeLEDs were substantially stable at ambient conditions (with relative humidity above 60%), and produced consistent luminescence-voltage curves over multiple scans, as depicted at FIG. 13.

Figure 14:
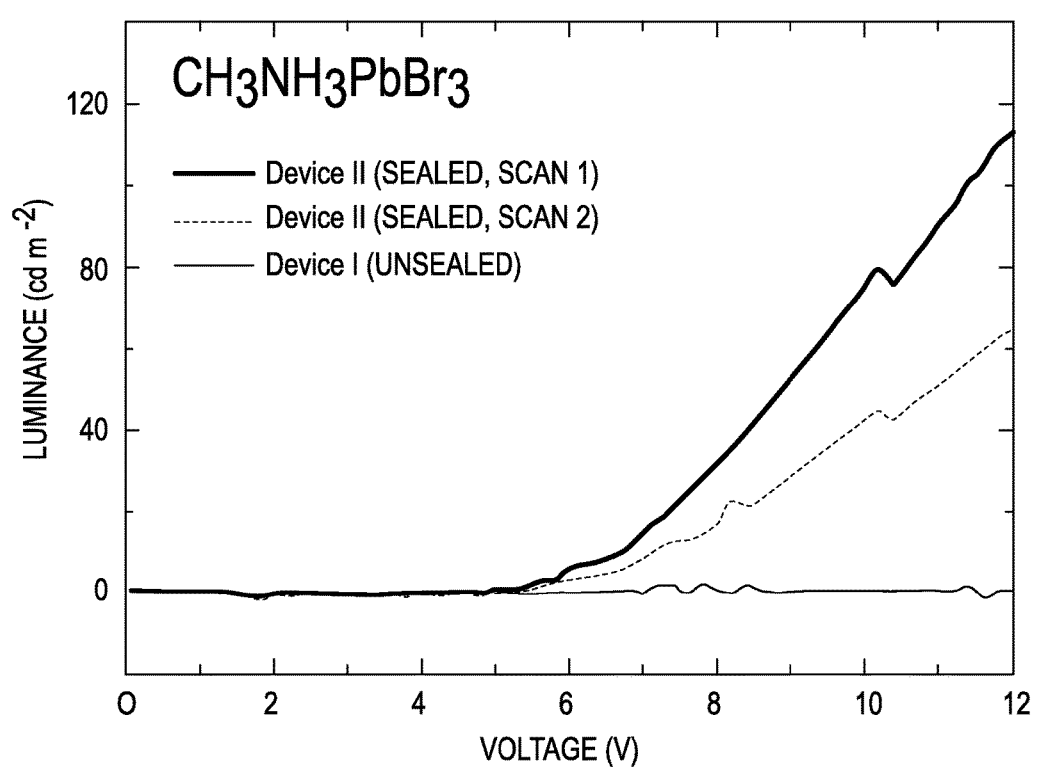
FIG. 14 depicts luminescence-voltage curves measured for embodiments of H$_3$NH$_3$PbBr$_3$-based LEDs having the same device architecture as the embodiment of FIG. 13.

In contrast, as depicted at FIG. 14, $CH_3NH_3PbBr_3$-based LEDs without encapsulation emitted essentially no light at ambient conditions, likely due to rapid degradation of the perovskite layer when exposed to humidity. Detectable luminance could be collected from encapsulated $CH_3NH_3PbBr_3$-based LEDs, but obvious decay of luminescence was observed between two consecutive scans (FIG. 14, Device II).

We claim:

1. A method of making a film comprising an all-inorganic perovskite, the method comprising:
   providing a precursor formulation comprising an all-inorganic perovskite, a polymer, and a liquid, wherein the weight ratio of the polymer to the all-inorganic perovskite in the precursor formulation is about 0.02:1 to about 0.5:1; and
   casting the precursor formulation to form a film comprising the all-inorganic perovskite.

2. The method of claim 1, wherein the weight ratio of the polymer to the all-inorganic perovskite in the precursor formulation is about 0.05:1 to about 0.3:1.

3. The method of claim 1, wherein the all-inorganic perovskite comprises a metal halide perovskite.

4. The method of claim 1, wherein the all-inorganic perovskite is $CsPbBr_3$.

5. The method of claim 1, wherein the polymer is a polyether, a polyacrylate, or a combination thereof.

6. The method of claim 1, wherein the polymer comprises poly(ethylene oxide).

7. The method of claim 1, wherein the polymer is soluble in the liquid, and the liquid is present in the precursor formulation at an amount sufficient to dissolve the polymer.

8. The method of claim 1, wherein the polymer has a number average molecular weight of about 100,000 g/mol to about 8,000,000 g/mol.

9. The method of claim 1, wherein the liquid is an organic polar aprotic liquid.

10. The method of claim 1, wherein the liquid comprises dimethyl sulfoxide.

11. The method of claim 1, further comprising annealing the film to remove substantially all of the liquid.

12. The method of claim 1, further comprising washing the film with chlorobenzene.

13. The method of claim 1, wherein casting the precursor formulation comprises spin-casting the precursor formulation.

14. The method of claim 1, wherein the film layer is at least substantially pinhole-free.

15. A method of making a film comprising an all-inorganic perovskite, the method comprising:
   providing a precursor formulation comprising a metal halide perovskite, a polyether, and a liquid, wherein the weight ratio of the polyether to the metal halide perovskite in the precursor formulation is about 0.02:1 to about 0.5:1; and
   casting the precursor formulation to form a film comprising the metal halide perovskite.

* * * * *